United States Patent [19]
Gorecki

[11] Patent Number: 5,574,678
[45] Date of Patent: Nov. 12, 1996

[54] CONTINUOUS TIME PROGRAMMABLE ANALOG BLOCK ARCHITECTURE

[75] Inventor: James L. Gorecki, Hillsboro, Oreg.

[73] Assignee: Lattice Semiconductor Corp., Hillsboro, Oreg.

[21] Appl. No.: 396,994

[22] Filed: Mar. 1, 1995

[51] Int. Cl.[6] .................................................. G06G 7/00
[52] U.S. Cl. ............................................................ 364/807
[58] Field of Search ..................................... 364/807, 716, 364/602; 326/37–39; 365/45

[56] References Cited

U.S. PATENT DOCUMENTS 5,017,146   4/1992   El-Ayat ...................................... 326/38

OTHER PUBLICATIONS

Scott D. Willingham, Kenneth W. Martin, and A. Ganesa, "A BiCMOS Los–Distortion 8–MHz Los–Pass Filter", IEEE Journal of Solid–State Circuits, vol. 28, No. 12, Dec. 1993, pp. 1234–1245.

*Primary Examiner*—Tan V. Mai
*Attorney, Agent, or Firm*—Skjerven, Morrill, MacPherson, Franklin & Friel; Stephen A. Terrile

[57] ABSTRACT

A programmable analog circuit apparatus receives a differential analog input signal and provides a processed differential analog output signal. The programmable analog circuit apparatus includes a first input transconductor, a differential amplifiers, and a feedback transconductor. The first input transconductor has a programmable transconductance and includes an input transconductor positive input terminal and an input transconductor negative input terminal and an input transconductor positive output terminal and an input transconductor negative output terminal. The positive and negative input terminals are coupled to receive the differential analog input signal. The differential amplifier includes first and second amplifier input terminals and first and second amplifier output terminals. The positive and negative input transconductor output terminals are coupled to the first and second differential amplifier input terminals. The amplifier output terminals are coupled to the first and second amplifier input terminals. The amplifier provides the processed differential analog output signal via the amplifier output terminals. The feedback transconductor includes a positive feedback transconductor input terminal and a negative feedback transconductor input terminal and a positive feedback transconductor output terminal and a negative feedback transconductor output terminal. The positive and negative feedback transconductor input terminals are coupled to the first and second amplifier output terminals and the positive and negative feedback transconductor output terminals are coupled to the first and second amplifier input terminals. The feedback transconductor output terminals has a high output impedance.

23 Claims, 6 Drawing Sheets

CONTINUOUS TIME PROGRAMMABLE ANALOG BLOCK ARCHITECTURE

BACKGROUND OF THE INVENTION

The present invention relates to analog processing, and more particularly to integrated circuits which perform analog processing functions.

Typically, analog integrated circuits are designed to receive one or more analog input signals, and process them by performing specific functions such as gain, attenuation, filtering, integration, addition and subtraction. These functions usually dictate the topology of the analog integrated circuit. For example, the topologic arrangement of operational amplifiers and resistors are adjusted to provide either inverting or non-inverting gain. Every topology has specific noise, distortion and offset voltage sensitivities. Changing an analog circuit's function necessitates a change in the topology of the analog circuit, which thus changes the noise, distortion and offset voltage characteristics of the circuit.

It is known to change a circuit's topology by reconnecting circuits at the board level or the integrated circuit level via wires, metal layers, etc. For example mask programmable circuits, gate arrays and linear circuit arrays allow the circuit and the function of the circuit to be changed at time of manufacture. However, even changes at this level cause changes in the parasitics of resistance and capacitance and thus lead to variations in performance.

When metal oxide semiconductor (MOS) switches are used to provide programmability by varying the topology, further parasitics are introduced. In particular, MOS transistors exhibit a square-law characteristic of gate to source voltage versus output current and thus MOS transistors can seriously increase distortion when they are placed in a signal path.

SUMMARY OF THE INVENTION

It has been discovered that providing an analog circuit with a programmable analog circuit block architecture permits change in a function of the analog circuit without changing the topology of the circuit elements. This architecture reduces changes in voltage offset and distortion created by changes in topologies.

The programmable analog circuit block, referred to as a programmable analog circuit cell (PACell™) or sometimes referred to as a configurable analog block (CAB), provides a self contained integrated circuit architecture which supports basic analog processing functions. The input and output characteristics of the programmable analog circuit block allow the block to be used within an interconnection array with other programmable analog circuit blocks to provide more complicated analog circuits without degradation in the total harmonic distortion.

By removing the sensitivity to an interconnection array and facilitating internal modification of function without changing the topologic sensitivity to offset and distortion, an integrated circuit can advantageously be provided with multiple programmable analog circuit blocks and an interconnection array which can accommodate more complex analog functions.

Additionally, control of this programmability may also be placed in a memory, be it located either on-chip or off-chip. This memory may be implemented using static read only memory, dynamic random access memory, static random addressable memory, a serial string of shift registers, serial electronically erasable ($E^2$) memory, or any other memory.

In a preferred embodiment, the invention relates to a programmable analog circuit apparatus which receives a differential analog input signal and provides a processed differential analog output signal. The programmable analog circuit apparatus includes a first input transconductor, a differential amplifier, and a feedback transconductor. The first input transconductor has a programmable transconductance and includes an input transconductor positive input terminal and an input transconductor negative input terminal and an input transconductor positive output terminal and an input transconductor negative output terminal. The positive and negative input terminals are coupled to receive the differential analog input signal. The amplifier includes first and second amplifier input terminals and first and second amplifier output terminals. The positive and negative input transconductor output terminals are coupled to the first and second amplifier input terminals. The amplifier output terminals are coupled to the first and second amplifier input terminals. The amplifier provides the processed differential analog output signal via the amplifier output terminals. The feedback transconductor includes a positive feedback transconductor input terminal and a negative feedback transconductor input terminal and a positive feedback transconductor output terminal and a negative feedback transconductor output terminal. The positive and negative feedback transconductor input terminals are coupled to the first and second amplifier output terminals and the positive and negative feedback transconductor output terminals are coupled to the first and second amplifier input terminals. The feedback transconductor output terminals has a high output impedance.

DETAILED DESCRIPTION

The following sets forth a detailed description of the best contemplated mode for carrying out the invention. The description is intended to be illustrative of the invention and should not be taken to be limiting.

Figure 1:
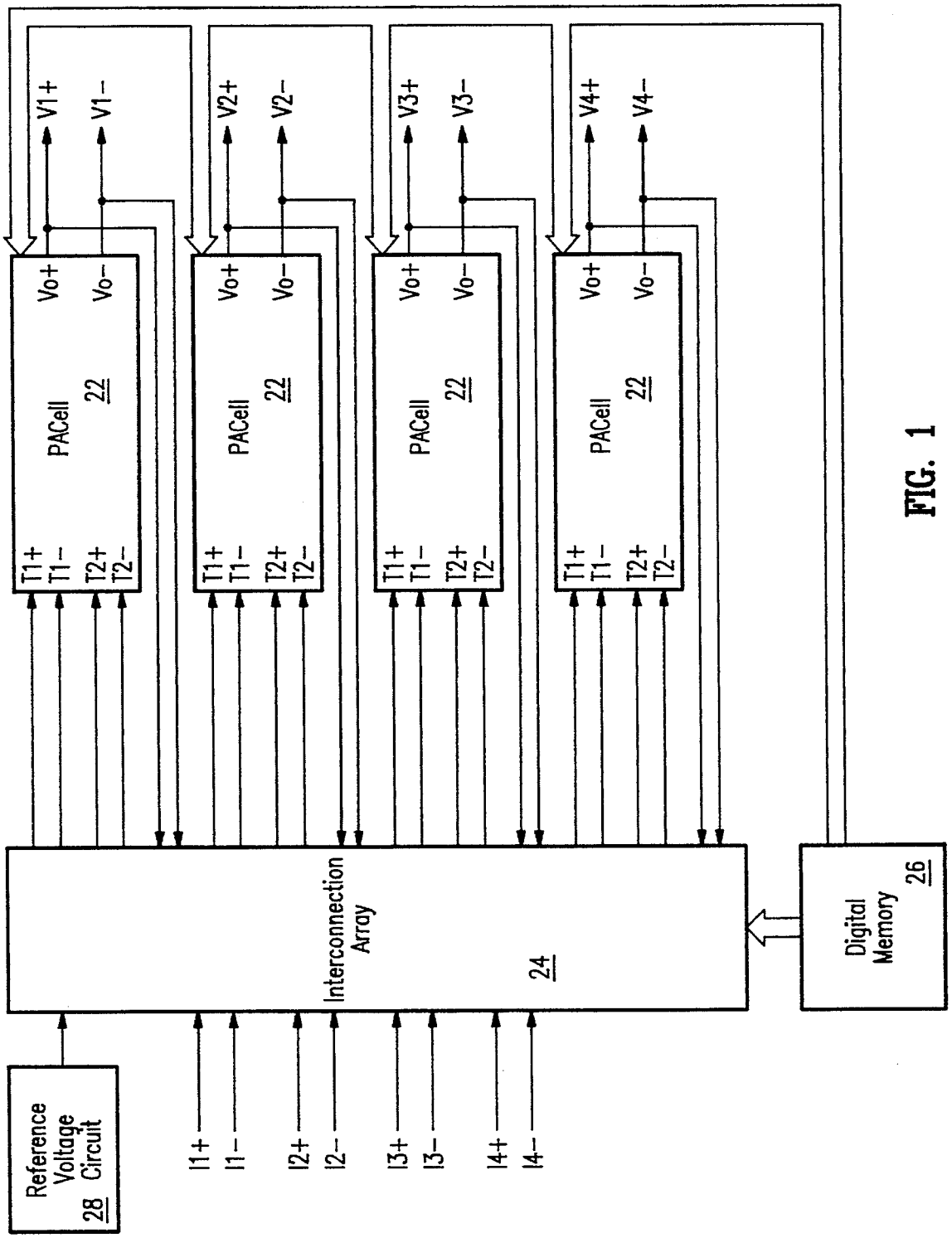
FIG. 1 shows a schematic block diagram of a programmable analog circuit system in accordance with the present invention.

Referring to FIG. 1, programmable analog circuit system 20 includes a plurality of programmable analog circuit blocks (i.e., PACell circuits) 22, as well as interconnection array 24, memory 26 and reference voltage circuit 28. Each programmable analog circuit block 22 is coupled to interconnection array 24. Additionally, memory 26 and reference voltage circuit 28 are coupled to interconnection array 24.

Interconnection array 24 receives four differential input signals, I1, I2, I3, and I4, as well as inputs from memory 26 and reference voltage circuit 28. Interconnection array 24 interfaces with each of the programmable analog circuit blocks 22.

Interconnection array 24 controls the routing of the differential input signals to the various programmable analog circuit blocks 22. Interconnection array 24 also controls the routing of the output signals of each of the various programmable analog circuit blocks 22 to itself and other programmable analog circuit blocks 22.

The routing of the interconnection array is determined by information stored in memory 26. More specifically, each bit which is stored within memory 26 controls whether a switch of interconnection array 24 is on or off. Memory 26 also stores the information for programming the various programmable analog circuit blocks 22.

Each programmable analog circuit block 22 has a programmable gain range (e.g., 0 dB to +20 dB), low distortion (e.g., total harmonic distortion (THD) <−74 dB max @10 KHz), low offset voltage (e.g., 2 mV max) and wide bandwidth (e.g., 800 khz). Each programmable analog circuit block 22 includes precision elements which replace a variety of analog components such as operational amplifiers and active filters, along with their associated external resistors and capacitors. Functions that can be implemented with the programmable analog circuit block 22 are addition, subtraction, integration, single-pole filtering, attenuation and gain of analog signals.

Reference voltage circuit 28 provides a 2.5 Volt reference voltage (when receiving a 5 volt input voltage ($V_{cc}$)) to interconnection array 24.

Figure 2:
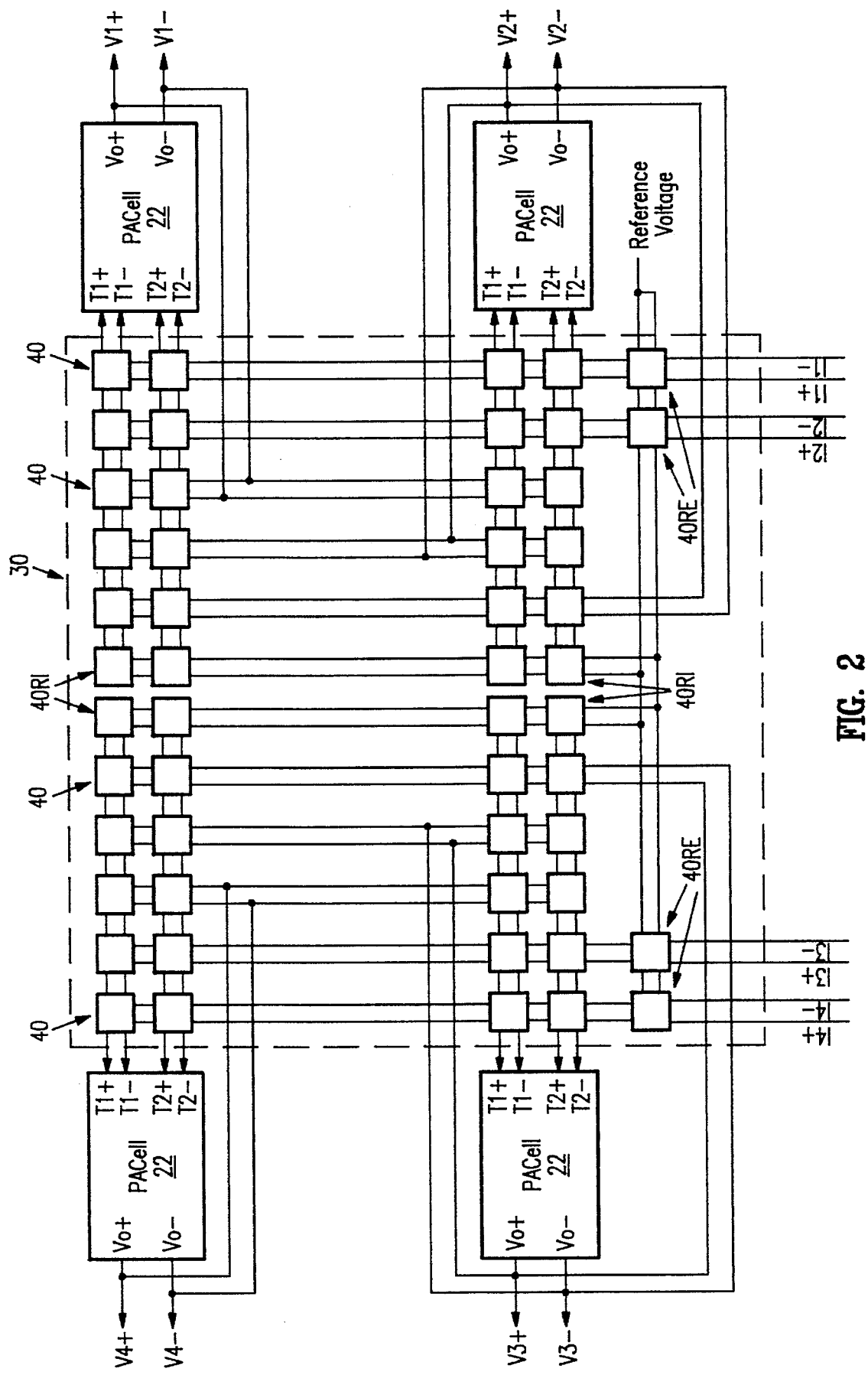
FIG. 2 shows a schematic block diagram of the interconnection of a plurality of programmable analog circuit blocks to provide a programmable analog circuit in accordance with the present invention.

Referring to FIG. 2, a more detailed view of programmable interconnection array 24 is shown. Programmable interconnection array 24 includes a plurality of connection points 40. Because of the input and output properties of the programmable analog circuit block, specifically, high input impedance and low output impedance, multiple programmable analog circuit blocks 22 may be interconnected to provide a programmable analog circuit which performs more complex signal processing. This interconnection is performed using connection points 40 through which virtually no DC current flows.

By selectively controlling the state of the connection points 40, the output of one or more programmable analog circuit blocks 22 may be provided as an input to itself or to other programmable analog circuit blocks 22. Additionally, external inputs I1, I2, I3, or I4 may also be connected to one or more programmable analog circuit blocks 22. Accordingly, an analog circuit may be provided which provides various complex analog processing functions. For example, functions such as higher order filtering, addition of more than two input signals, higher gain than may be provided by a single programmable analog circuit block.

Input signal lines which are provided to the interconnection array 24 but are not programmed to be connected to a programmable analog circuit block 22 are automatically connected via external reference voltage connection points 40RE to the reference voltage provided by reference voltage circuit 28. Additionally, if no input from the interconnection array 24 is programmed to be connected to the input terminals of a programmable analog circuit block 22, the input terminals of that programmable analog circuit block are automatically connected, via internal reference voltage connection points 40RI to the reference voltage.

Figure 3:
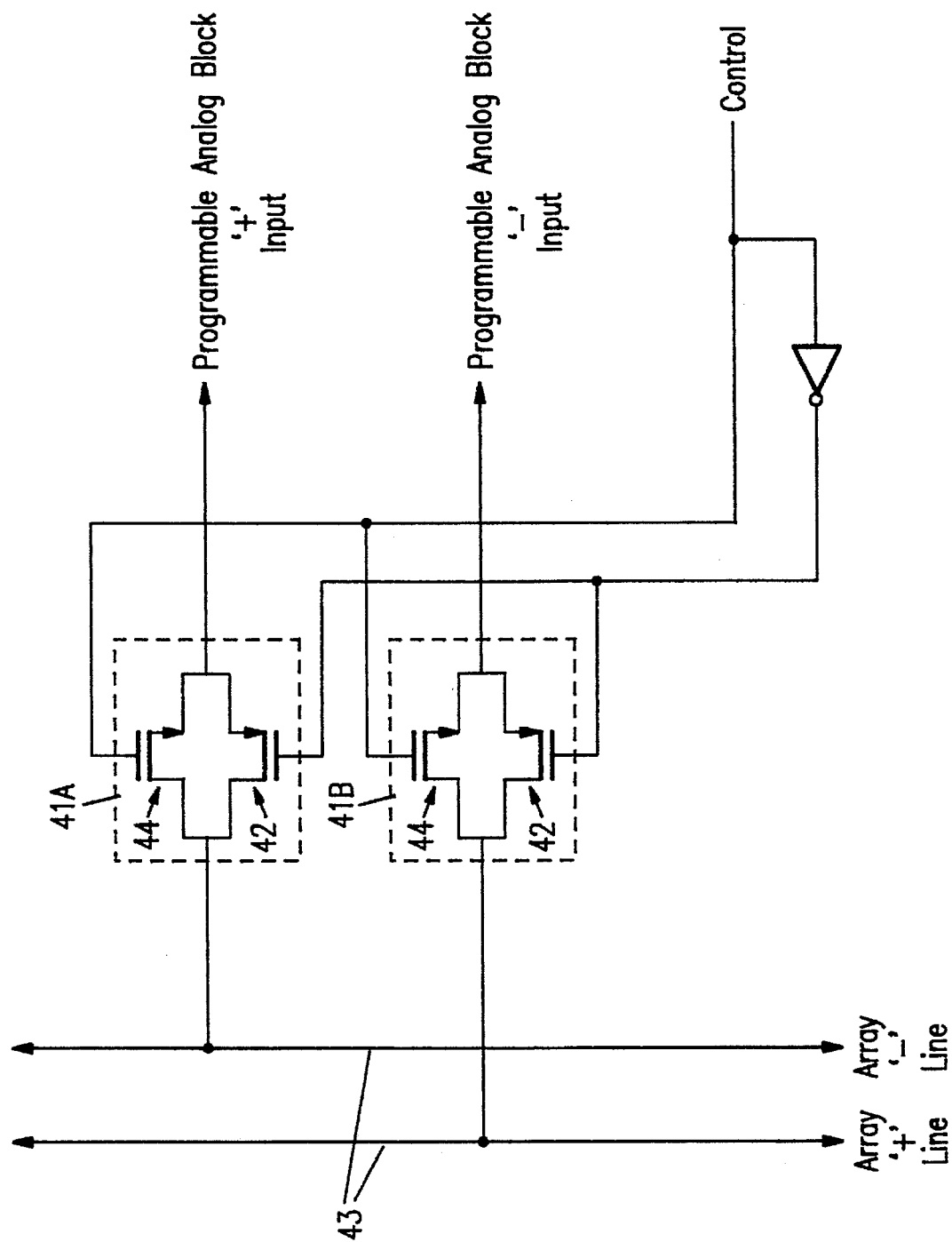
FIG. 3 shows a schematic diagram of a connection point within an analog interconnection array of the FIG. 2 programmable analog circuit system.

Referring to FIG. 3, each connection point 40, 40RE and 40RI includes two switches 41a, 41b, each including a P channel metal oxide semiconductor (PMOS) transistor 42 and a N channel metal oxide semiconductor transistor (NMOS) transistor 44. These switches may be referred to as a complementary CMOS switch and also as a CMOS transfer gate. The sources and drains of the transistors are connected between the array lines 43 and respective programmable analog circuit block input terminals. For external reference voltage connection points 40RE and internal reference voltage connection points 40RI, both array lines 43 are coupled to the reference voltage.

The gates of each of transistors 42, 44 are coupled to complementary control signals which control whether the switch should be turned "on", in which case the resistance of the switch is low, e.g., <1000 ohms, or turned "off", in which case the resistance of the switch is high, e.g., $10^9$ ohms, i.e., the switch effectively functions as an open circuit. The control signal is provided based upon information which is stored within memory 26.

Because virtually no DC current flows through the connection points 40, these connection points 40 do not contribute any noise or distortion to the programmable analog circuit system. Accordingly, each programmable analog circuit block 22 must only drive a small capacitive load, leaving a large portion of the drive capability of each programmable analog circuit block 22 to drive external components.

Figure 4:
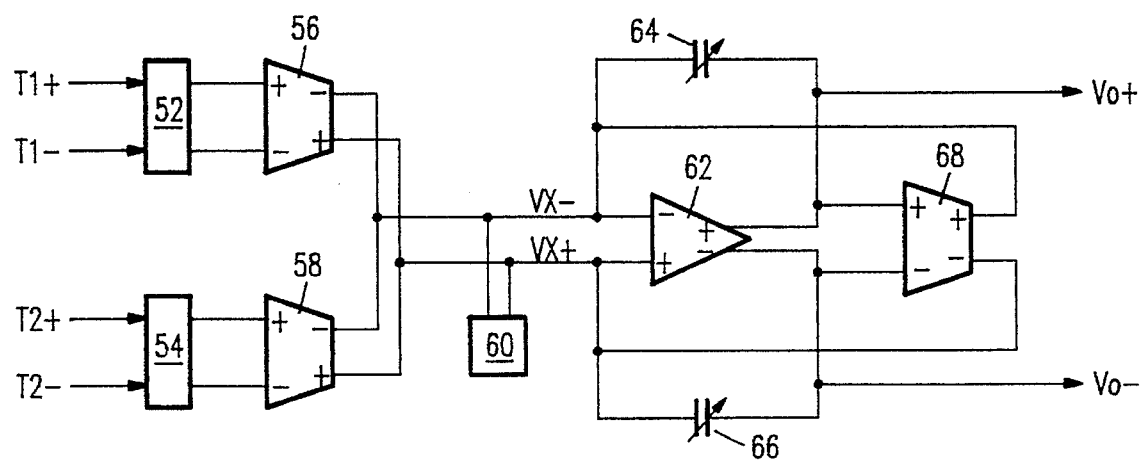
FIG. 4 shows a schematic block diagram of a programmable analog circuit block of the FIG. 1 programmable analog circuit system in accordance with the present invention.

Referring to FIG. 4, a schematic block diagram of a programmable analog circuit block 22 is shown. Programmable analog circuit block 22 includes polarity control circuits 52, 54, input transconductors 56, 58, terminator circuit 60, differential amplifier 62, programmable capacitor arrays 64, 66, and feedback transconductor 68. Programmable analog circuit block 22 is programmed based upon information which is stored within memory 26 (see FIG. 1).

Polarity control circuits 52, 54 are coupled to the input terminals of input transconductors 56, 58, respectively. The negative output terminals of input transconductors 56, 58 are coupled to the negative input terminal of differential amplifier 62. The positive output terminals of input transconductors 56, 58 are coupled to the positive input terminal of differential amplifier 62. Termination circuit 60 is coupled across the inputs of differential amplifier 62. Programmable capacitor arrays 64, 66 are coupled between respective inputs and outputs of differential amplifiers 62. The outputs of differential amplifier 62 are provided as outputs of the programmable analog circuit block 22 and are also provided to the inputs of feedback transconductor 68 and programmable capacitor arrays 64, 66. The positive output terminal of feedback transconductor 68 is coupled to the negative input terminal of differential amplifier 62 and the negative output terminal of feedback transconductor 68 is coupled to the positive input terminal of differential amplifier 62.

Polarity control for the input signals which are provided to input transconductors 56, 58 is performed by polarity control multiplexers 52, 54. Polarity control multiplexers 52, 54 each receive a single differential input line and under control of information stored within memory 26 couples the signal to both the positive '+' and negative '−' transconductor inputs.

A transconductor, e.g., input transconductors 56, 58 and feedback transconductor 68, is a differential voltage to differential current converter. The transconductor has high input impedance, e.g., $10^{10}$ ohms and high output impedance, e.g., >100 MOhms; additionally, the output of the transconductor is tri-statable to configurably provide no current output from the transconductor. The differential output current, I, is set forth as follows:

$$I = GM \times V_{IN}$$

where $V_{IN}$ is the differential input voltage and GM is the transconductance of the transconductor.

The high input impedance permits the input of the transconductor to be connected to other devices without requiring DC current, i.e., without loading down the other devices. Additionally, the high output impedance permits several transconductors to be connected in parallel, thus summing the currents of the transconductors without affecting the GM value of each individual transconductor. Additionally, the transconductor output currents can be turned off (i.e., tri-stated), thus effectively eliminating the transconductor from the circuit.

Because the transconductor has a high input impedance, MOS devices preceding the input to the transconductor have no DC current flowing through them. As such, these devices do not contribute to noise or distortion.

By coupling the outputs of differential amplifier 62 to the inputs of differential amplifier 62, these inputs effectively become a virtual ground. I.e., a point in the circuit which is effectively held to zero differential voltage by means of the high gain of differential amplifier 62.

Differential amplifier 62 holds differential amplifier inputs effectively to zero differential voltage and provides a low output impedance to drive external circuitry or other programmable analog circuit blocks 22. By holding the virtual ground to effectively zero differential voltage, differential amplifier 62 eliminates distortion due to parasitic capacitances at the outputs of the transconductors and capacitor array.

Programmable capacitor arrays 64, 66 are used to add or eliminate capacitance from programmable analog circuit block 22. Each programmable capacitor array 64, 66 includes integrated capacitors and a plurality of MOS switches controlling which, if any, integrated capacitor is active within programmable analog circuit block 22. Capacitors that are not active within the capacitor array are automatically connected to the reference voltage, thus absolutely eliminating the capacitors that are not active from any circuit interaction.

Figure 5:
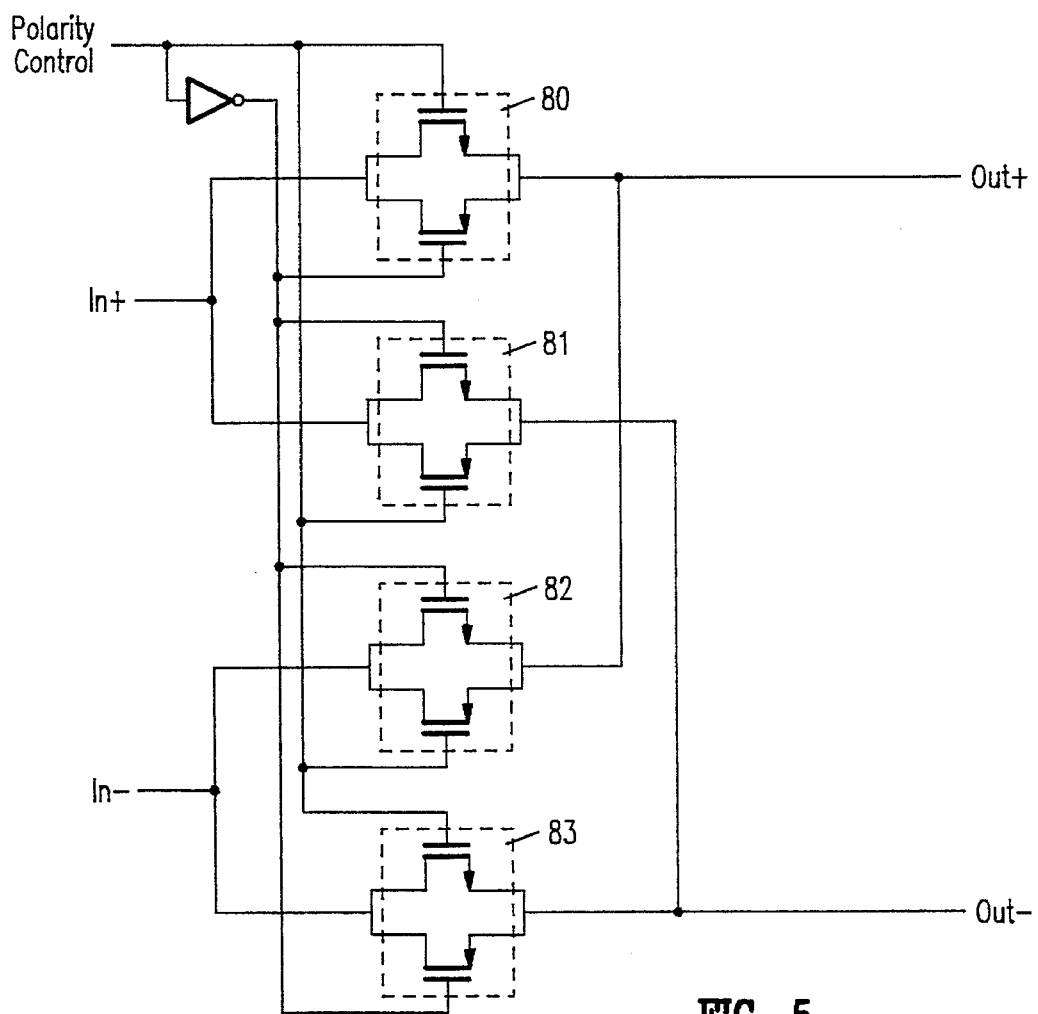
FIG. 5 shows a schematic diagram of a polarity control multiplexer in accordance with the present invention.

Referring to FIG. 5, each polarity control multiplexer circuit 52, 54 includes switches 80, 81, 82, 83. Switches 80, 81 are connected to the positive input signal; switches 82, 83 are connected to the negative input signal. Switches 80, 83 are connected to the positive output signal; switches 81, 82 are connected to the negative output signal.

When the polarity control signal is active, switches 80, 83 are on and switches 81, 82 are off, thus connecting the positive input terminal to the positive output terminal and the negative input terminal to the negative output terminal. When the polarity control signal is inactive, switches 81, 82 are on and switches 80, 83 are off, thus connecting the positive input terminal to the negative output terminal and the negative input terminal to the positive output terminal. In this state, polarity control multiplexers 52, 54 invert the input terminal to output terminal relationship. The state of the switches is controlled by information which is stored within memory 26.

Figure 6:
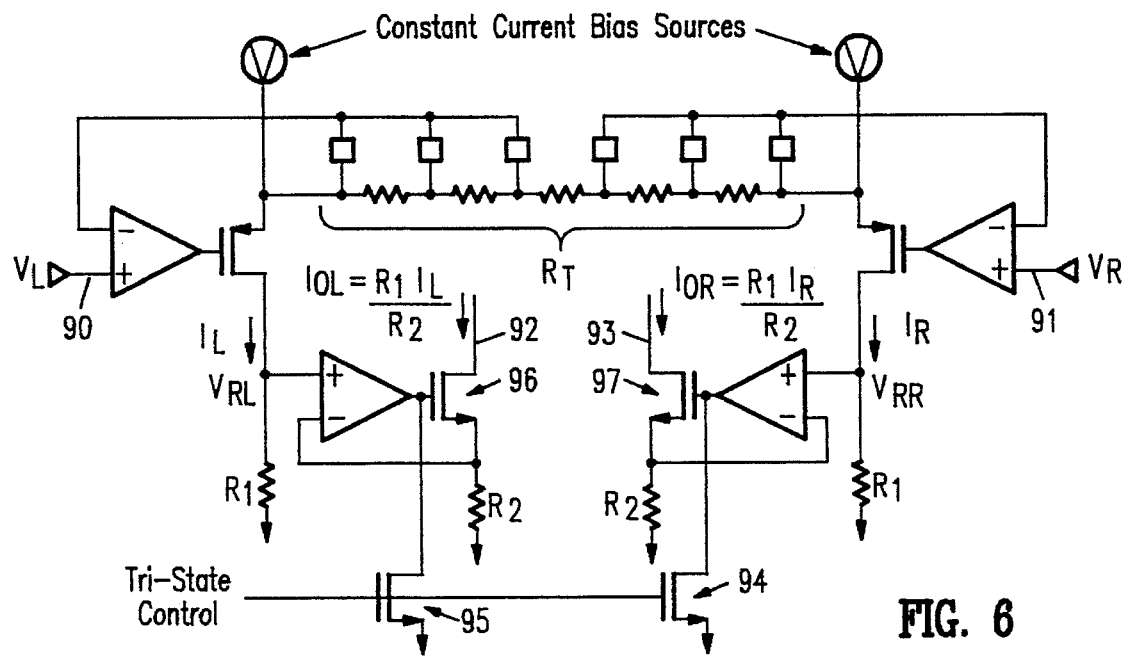
FIG. 6 shows a schematic block diagram of a programmable transconductor in accordance with the present invention.

Referring to FIG. 6, transconductors 56, 58 and 68 are generally known as a degenerated pair linearized by servo feedback, also known as a linearized, resistor based, transconductor. A differential input voltage, $V_L - V_R$ is received on voltage input terminals 90, 91 and a corresponding differential output current is generated at current output terminals 92, 93. The value of the differential output current is $$I = GM \times V_{IN}$$

For transconductors 56, 58, the value of GM is controlled directly by the portion of RT which is selected based upon information stored within memory 26.

Feedback transconductor 68 is similar to transconductors 56, 58, but has a fixed GM, whose value is determined by design.

The source and drain of transistors 94, 95 are connected between the gates of transistors 97, 96, respectively, and ground. The gates of transistors 94, 95 are connected to a tri-state control signal which controls whether the output terminals of the transconductor are tri-stated. When the tri-state control signal is active, transistors 94, 95 are on, connecting the gates of transistors 96, 97 to ground, thus turning transistors 96, 97 off. At the same time, the tri-state control signal also turns off the bias current for operational amplifiers 98, 99.

Figure 7:
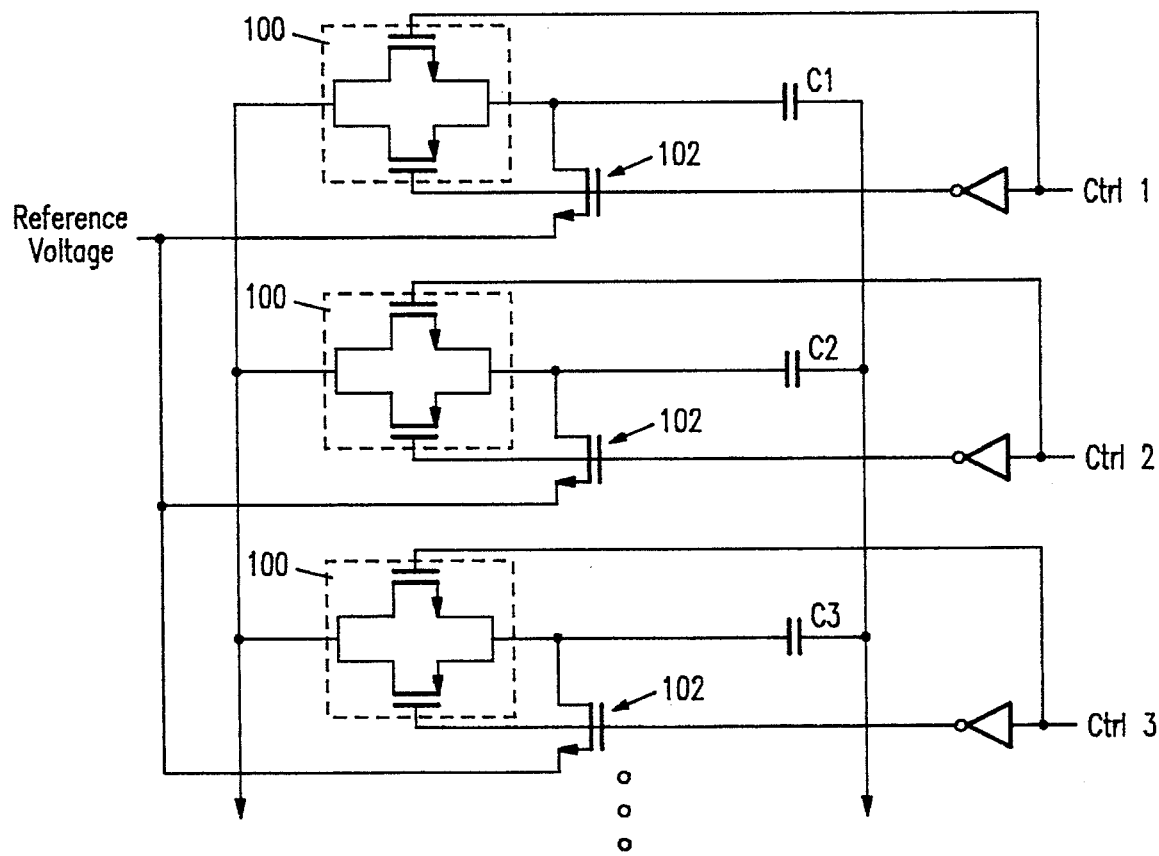
FIG. 7 shows a schematic block diagram of a programmable capacitor array in accordance with the present invention.

Referring to FIG. 7, a schematic diagram of a programmable capacitor array 64 is shown; capacitor array 66 is of the same architecture. Programmable capacitor array 64 includes a plurality of capacitors C1, C2, C3 having different capacitance values. Capacitors C1, C2, C3 are coupled to switches 100. The input of capacitor array 64 is coupled in parallel to all of the switches 100. The other side of each capacitor is coupled to the output of capacitor array 64. Accordingly, by turning on or off individual switches 100, the capacitance of capacitor array 64 may be programmably controlled. The information which controls capacitor array 64 is stored within memory 26.

When switches 100 are off, they represent an open circuit and the capacitors associated with those switches are not in the feedback path of differential amplifier 62. Thus, in addition to controlling the capacitance of capacitor array 64, each capacitor array 64, 66 may also programmably functionally be removed from programmable analog circuit block 22.

Capacitors that are not active within the capacitor array are automatically connected to the reference voltage via the NMOS transistor 102 of switch 100, thus absolutely eliminating the capacitors that are not active from any circuit interaction.

Figure 8:
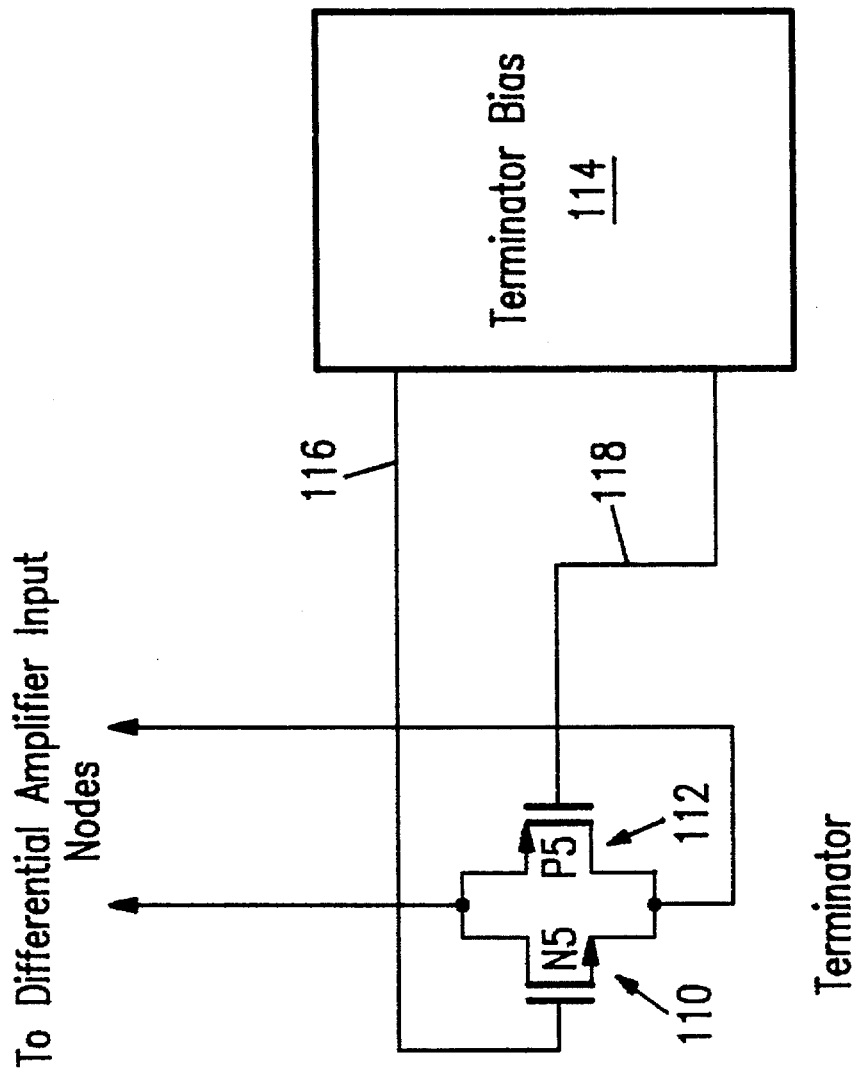
FIG. 8 shows a schematic block diagram of a termination circuit in accordance with the present invention.

Referring to FIG. 8, termination circuit 60 is shown. Termination circuit 60 includes transistors 110 and 112 as well as terminator bias circuit 114. The source and drains of transistors 110 and 112 are coupled between the input terminals of differential amplifier 62 and create an effective resistance between those terminals to reduce the closed loop gain of programmable analog circuit block 22 to insure stability.

The value of the resistance created by transistor 110 in parallel with transistor 112 is equal to or less than the value of 1/GM of feedback transconductor 68. This resistance value is controlled by terminator bias circuit 114. Terminator bias circuit 114 generates bias voltages 116, 118 which are coupled to the gates of transistors 110, 112, respectively. Terminator bias circuit 114 produces bias voltages 110, 112, thus insuring that the resistance of transistor 110 in parallel with transistor 112 is less than or equal to 1/GM of feedback transconductor 68.

Referring again to FIG. 4, the output currents of transconductors 56, 58 are summed at the input terminals of differential amplifier 62. Feedback transconductor 68 functions as a feedback resistor. When feedback transconductor 68 is active, i.e., not tri-stated, it supplies current back to the differential amplifier input terminals. Therefore, feedback transconductor 68 effectively closes the loop and functions as a conventional resistor in an operational amplifier feedback circuit.

When transconductor 68 is off, i.e., tri-stated, programmable analog circuit block 22 operates as an integrator whose value depends on the input transconductance and the programmed capacitor value. More specifically, $$V_{out} = \frac{GM1}{Cap} \times [\mp V_{in}1] + \frac{GM2}{Cap} \times [\mp V_{in}2]$$

When transconductor 68 is on, programmable analog circuit block 22 functions as single-pole filter. More specifically, $$V_{out} = \frac{GM1}{GM3 \times Cap} \times [\mp V_{in}1] + \frac{GM2}{GM3 \times Cap} \times [\mp V_{in}2]$$

When programmable capacitor arrays 64, 66 are off, programmable analog circuit block 22 functions as a gain stage. More specifically, $$V_{out} = \frac{GM1}{GM3} \times [\mp V_{in}1] + 3\frac{GM2}{GM3} \times [\mp V_{in}2]$$

In these equations, GM1 and GM2 represent the transconductance of input transconductors 56, 58 and GM3 represents the transconductance of feedback transconductor 68. Additionally, Cap represents the programmed capacitor value of programmable capacitor array 64, 66.

Programmable analog circuit block 22 uses termination circuit 60 to control loop gain and to stabilize programmable analog circuit block 22. With termination circuit 60 connected as shown, the loop gain is:

*LoopGain=AolxGM3xRz* where Aol is the open loop gain of differential amplifier 62, GM3 is the transconductance of feedback transconductor 68 and Rz is the effective resistance of the parallel combination of transistors 110 and 112 controlled by terminator bias circuit 114. If Rz≅1/GM3 then the loop gain of programmable analog circuit block 20 is simply the gain of differential amplifier 62.

If differential amplifier 62 is stable, then programmable analog circuit block 22 is stable. Note that stability for programmable analog circuit block 22 requires a small additional capacitance in the location of the programmable capacitors to offset phase degradation of the input transconductors. However, without termination circuit 60, programmable analog circuit block 22 is impossible to effectively compensate because the loop gain of programmable analog circuit block 22 would be to too high, e.g., >130 dB. More specifically, because differential amplifier 62 provides a large amplification, relatively small fluctuations on the input side of differential amplifier 60 result in large fluctuations at the output of differential amplifier 60.

Other Embodiments

Other embodiments are within the following claims.

Also for example, while the programmable analog circuit system is shown with four programmable analog circuit blocks, a programmable analog circuit system having any number of programmable analog circuit blocks is within the scope of the invention.

What is claimed is:

1. A programmable analog circuit apparatus, the programmable analog circuit apparatus receiving a differential analog input signal and providing a processed differential analog output signal comprising a first input transconductor, the input transconductor having a programmable transconductance, the input transconductor having an input transconductor positive input terminal and an input transconductor negative input terminal coupled to receive the differential analog input signal and an input transconductor positive output terminal and an input transconductor negative output terminal;

an amplifier, the amplifier including first and second amplifier input terminals and first and second amplifier output terminals, the positive and negative input transconductor output terminals being coupled to the first and second amplifier input terminals, the amplifier output terminals being coupled to the first and second amplifier input terminals, the amplifier output terminals providing the processed differential analog output signal;

a feedback transconductor, the feedback transconductor including a feedback transconductor positive input terminal and a feedback transconductor negative input terminal and a feedback transconductor positive output terminal and a feedback transconductor negative output terminal, the feedback transconductor positive and negative input terminals being coupled to the first and second amplifier output terminals and the feedback transconductor positive and negative output terminals being coupled to the first and second amplifier input terminals, the feedback transconductor output terminals having a high output impedance.

2. The programmable analog circuit apparatus of claim 1 further comprising a second input transconductor, the second input transconductor having a programmable gain, the second input transconductor having a second positive input transconductor input terminal and a second negative input transconductor input terminal coupled to receive a second differential analog input signal and positive and negative second input transconductor output terminals, the positive and negative second input transconductor output terminals being coupled to the first and second amplifier input terminals.

3. The programmable analog circuit apparatus of claim 2 wherein the first input transconductor and the second input transconductor each are tri-statable such that the first input transconductor and the second input transconductor may be programmably disconnected from the programmable analog circuit apparatus.

4. The programmable analog circuit apparatus of claim 1 wherein the feedback transconductor is tri-statable such that the feedback transconductor may be programmably disconnected from the programmable analog circuit apparatus.

5. The programmable analog circuit apparatus of claim 1 further comprising
an active circuit creating a resistance coupled between the input terminals of the amplifier so as to reduce the loop gain of the programmable analog circuit.

6. The programmable analog circuit apparatus of claim 1 further comprising
a programmable capacitor circuit coupled between the amplifier output terminal and one of the amplifier input terminals thus allowing the programmable analog circuit apparatus to provide the processed analog output signal with integration and filter poles.

7. The programmable analog circuit apparatus of claim 1 wherein
the input transconductor has a high input impedance.

8. The programmable analog circuit apparatus of claim 1 wherein
the feedback transconductor has a high input impedance.

9. The programmable analog circuit apparatus of claim 1 wherein
the analog input signal has a polarity; and further comprising
a polarity control circuit coupled to the input transconductor input terminal, the polarity control circuit controlling the polarity of the analog input signal provided to the input transconductor.

10. A programmable analog circuit system, the programmable analog circuit system receiving a differential analog input signal and providing a processed differential analog output signal, the programmable analog circuit system comprising:
a first programmable analog circuit block, the first programmable analog circuit block having first analog circuit block positive and negative input terminals and first analog circuit block positive and negative output terminals, the first programmable analog circuit block having a high input impedance and a low output impedance;
a second programmable analog circuit block, the second programmable analog circuit block having second analog circuit block positive and negative input terminals and second analog circuit block positive and negative output terminals, the second programmable analog circuit block having a high input impedance and a low output impedance; and,
an interconnections array, the interconnection array controlling the routing of the differential analog input signal and signals provided by and to the first and second programmable analog circuit blocks, the interconnection array being programmable.

11. The programmable analog circuit system of claim 10 further comprising
a memory coupled to the interconnection array, the memory storing information for use in programming the interconnection array.

12. The programmable analog circuit system of claim 11 wherein
the memory is nonvolatile.

13. The programmable analog circuit system of claim 11 wherein
the memory is nonvolatile.

14. The programmable analog circuit system of claim 11 wherein each of the first and second programmable analog circuit blocks include
a first input transconductor, the input transconductor having a programmable transconductance, the input transconductor having an input transconductor positive input terminal and an input transconductor negative input terminal coupled to receive the differential analog input signal and an input transconductor positive output terminal and an input transconductor negative output terminal;
an amplifier, the amplifier including first and second amplifier input terminals and first and second amplifier output terminals, the positive and negative input transconductor output terminals being coupled to the first and second amplifier input terminals, the amplifier output terminals being coupled to the first and second amplifier input terminals, the amplifier output terminals providing the processed differential analog output signal;
a feedback transconductor, the feedback transconductor including a feedback transconductor positive input terminal and a feedback transconductor negative input terminal and a feedback transconductor positive output terminal and a feedback transconductor negative output terminal, the feedback transconductor positive and negative input terminals being coupled to the first and second amplifier output terminals and the feedback transconductor positive and negative output terminals being coupled to the first and second amplifier input terminals, the feedback transconductor output terminals having a high output impedance.

15. The programmable analog circuit system of claim 14 wherein each of the first and second programmable analog circuit blocks further includes
a second input transconductor, the second input transconductor having a programmable gain, the second input transconductor having a second positive input transconductor input terminal and a second negative input transconductor input terminal coupled to receive a second differential analog input signal and positive and negative second input transconductor output terminals, the positive and negative second input transconductor output terminals being coupled to the first and second amplifier input terminals.

16. The programmable analog circuit system of claim 15 wherein
the first input transconductor and the second input transconductor each are tri-statable such that the first input transconductor and the second input transconductor may be programmably disconnected from the programmable analog circuit apparatus.

17. The programmable analog circuit system of claim 14 wherein
the feedback transconductor is tri-statable such that the feedback transconductor may be programmably disconnected from the programmable analog circuit apparatus.

18. The programmable analog circuit system of claim 14 wherein each of the first and second programmable analog circuit blocks further includes
an active circuit creating a resistance coupled between the input terminals of the amplifier so as to reduce the loop gain of the programmable analog circuit.

19. The programmable analog circuit system of claim 14 wherein each of the first and second programmable analog circuit blocks further includes
a programmable capacitor circuit coupled between the amplifier output terminal and one of the amplifier input terminals thus allowing the programmable analog circuit apparatus to provide the processed analog output signal with integration and filter poles.

20. The programmable analog circuit system of claim 14 wherein the input transconductor has a high input impedance.

21. The programmable analog circuit system of claim 14 wherein the feedback transconductor has a high input impedance.

22. The programmable analog circuit system of claim 14 wherein the analog input signal has a polarity; and each of the first and second programmable analog circuit blocks further includes a polarity control circuit coupled to the input transconductor input terminal, the polarity control circuit controlling the polarity of the analog input signal provided to the input transconductor.

23. The programmable analog circuit system of claim 10 further comprising a memory coupled to the first and second programmable analog circuit blocks, the memory storing information for use in programing the first and second analog circuit blocks.

* * * * *